(12) United States Patent
Hirase

(10) Patent No.: US 10,510,995 B1
(45) Date of Patent: Dec. 17, 2019

(54) FILM FORMATION METHOD AND METHOD OF MANUFACTURING DISPLAY DEVICE USING THE SAME

(71) Applicant: Sharp Kabushiki Kaisha, Sakai, Osaka (JP)

(72) Inventor: Takeshi Hirase, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/463,459

(22) PCT Filed: Sep. 28, 2017

(86) PCT No.: PCT/JP2017/035187
§ 371 (c)(1),
(2) Date: May 23, 2019

(87) PCT Pub. No.: WO2019/064417
PCT Pub. Date: Apr. 4, 2019

(51) Int. Cl.
*H01L 51/56* (2006.01)
*H01L 27/32* (2006.01)
(Continued)

(52) U.S. Cl.
CPC ............... *H01L 51/56* (2013.01); *B05D 1/60* (2013.01); *H01L 27/3244* (2013.01);
(Continued)

(58) Field of Classification Search
None
See application file for complete search history.

(56) References Cited

U.S. PATENT DOCUMENTS

| 6,045,864 A * | 4/2000 | Lyons ..................... B05D 1/60 |
| | | 427/255.23 |
| 2003/0205845 A1 | 11/2003 | Pichler et al. |

(Continued)

FOREIGN PATENT DOCUMENTS

| GB | 2 343 453 A | 5/2000 |
| JP | 2000-100803 A | 4/2000 |

(Continued)

OTHER PUBLICATIONS

Official Communication issued in International Patent Application No. PCT/JP2017/035187, dated Dec. 5, 2017.

*Primary Examiner* — Shaun M Campbell
(74) *Attorney, Agent, or Firm* — Keating & Bennett, LLP

(57) ABSTRACT

A film formation method of introducing, into a film formation chamber, a vaporized material obtained by vaporizing a liquid-form organic material in a vaporizing chamber and forming a vapor deposition film composed of the vaporized material on a surface of a film formed substrate placed within the film formation chamber. The method includes: holding an internal temperature of the vaporizing chamber at a lower temperature than a reaction temperature at which the organic material polymerizes; holding an internal pressure of the vaporizing chamber at a saturated vapor pressure of the organic material; setting an internal temperature of the film formation chamber to the same temperature as the internal temperature of the vaporizing chamber; and forming the film in a state where the film formed substrate is held at a temperature lower than the internal temperature of the film formation chamber.

7 Claims, 6 Drawing Sheets

(51) Int. Cl.
*H01L 51/52* (2006.01)
*B05D 1/00* (2006.01)
*H01L 51/00* (2006.01)

(52) U.S. Cl.
CPC ...... *H01L 51/0097* (2013.01); *H01L 51/5253* (2013.01); *H01L 2251/5338* (2013.01)

(56) References Cited

U.S. PATENT DOCUMENTS

| | | | | |
|---|---|---|---|---|
| 2007/0178225 | A1* | 8/2007 | Takanosu | C23C 14/243 427/69 |
| 2010/0119712 | A1* | 5/2010 | Irikura | B05D 1/60 427/294 |
| 2010/0272945 | A1 | 10/2010 | Nam et al. | |
| 2017/0352533 | A1* | 12/2017 | Tois | H01L 21/3065 |
| 2019/0283077 | A1* | 9/2019 | Pore | H01L 21/02118 |

FOREIGN PATENT DOCUMENTS

| | | |
|---|---|---|
| JP | 2003-347045 A | 12/2003 |
| JP | 2008-287996 A | 11/2008 |
| JP | 2010-003975 A | 1/2010 |
| JP | 2011-508374 A | 3/2011 |
| JP | 2016-145391 A | 8/2016 |

* cited by examiner

US 10,510,995 B1

FILM FORMATION METHOD AND METHOD OF MANUFACTURING DISPLAY DEVICE USING THE SAME

TECHNICAL FIELD

The disclosure relates to a film formation method and a method of manufacturing a display device using the same.

BACKGROUND ART

In recent years, organic EL display devices, which use organic electroluminescence (EL) elements and are of the self-luminous type, have attracted attention as display devices that can replace liquid crystal display devices.

For example, PTL 1 discloses a method of manufacturing an organic EL element, in which an organic light emitting element is formed by ejecting a vaporized material composed of an organic luminescent material toward a substrate from a nozzle located at a distance of 15 mm or less from the substrate.

CITATION LIST

Patent Literature

PTL 1: JP 2008-287996 A

SUMMARY

Technical Problem

However, with a vacuum vapor deposition method such as that disclosed in the above-described PTL 1, the film formed substrate and the nozzle are close to each other, and it is therefore difficult to ensure a uniform distribution in the flow of the vaporized material from the nozzle toward the film formed substrate. It is thus difficult to form a vapor deposition film having a uniform film thickness, particularly when depositing a material having a low saturated vapor pressure such as an acrylic resin.

Having been conceived in light of this point, an object of the disclosure is to form a vapor deposition film having a uniform film thickness.

Solution to Problem

To achieve the above-described object, a film formation method according to the disclosure is a film formation method of introducing, into a film formation chamber, a vaporized material obtained by vaporizing a liquid-form organic material in a vaporizing chamber and forming a vapor deposition film composed of the vaporized material on a surface of a film formed substrate placed within the film formation chamber. The method includes: holding an internal temperature of the vaporizing chamber at a lower temperature than a reaction temperature at which the organic material polymerizes; holding an internal pressure of the vaporizing chamber at a saturated vapor pressure of the organic material; setting an internal temperature of the film formation chamber to the same temperature as the internal temperature of the vaporizing chamber; and forming the film in a state where the film formed substrate is held at a temperature lower than the internal temperature of the film formation chamber.

Advantageous Effects of Disclosure

According to the disclosure, the internal temperature of the vaporizing chamber is held at a lower temperature than the reaction temperature at which the organic material polymerizes; the internal pressure of the vaporizing chamber is held at the saturated vapor pressure of the organic material; the internal temperature of the film formation chamber is set to the same temperature as the internal temperature of the vaporizing chamber; and the film is formed in a state where the film formed substrate is held at a temperature lower than the internal temperature of the film formation chamber. Accordingly, the vapor deposition film can be formed at a uniform thickness.

DESCRIPTION OF EMBODIMENTS

Embodiments of the disclosure will be described in detail below with reference to the drawings. The disclosure is not limited to the embodiments described below.

First Embodiment

Figure 1:
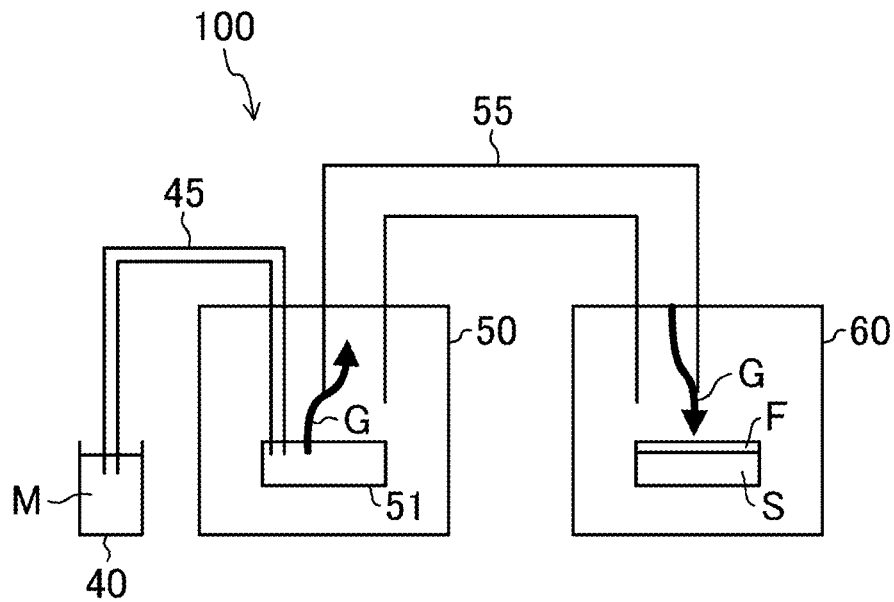
FIG. 1 is a schematic diagram illustrating an overview of a film formation apparatus used in a film formation method according to a first embodiment of the disclosure.
Figure 2:
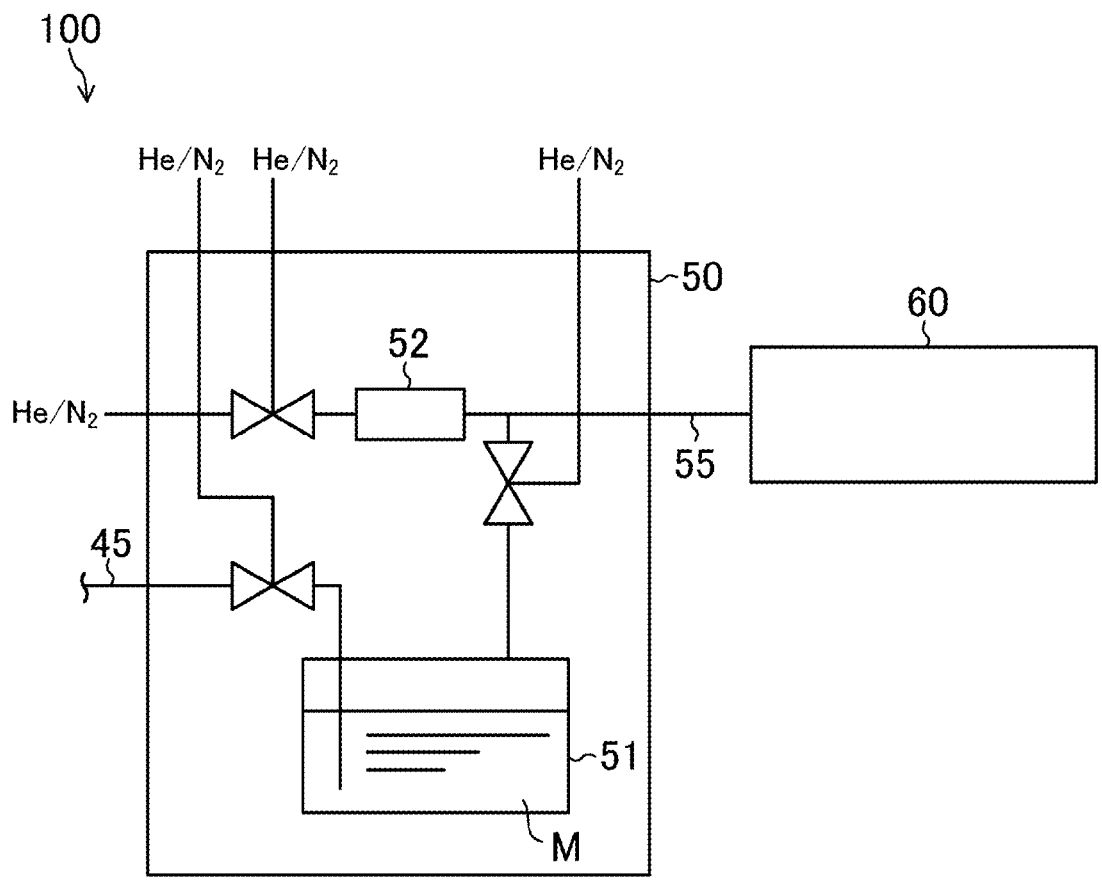
FIG. 2 is a schematic diagram primarily illustrating a vaporizing chamber constituting the film formation apparatus used in the film formation method according to the first embodiment of the disclosure.
Figure 3:
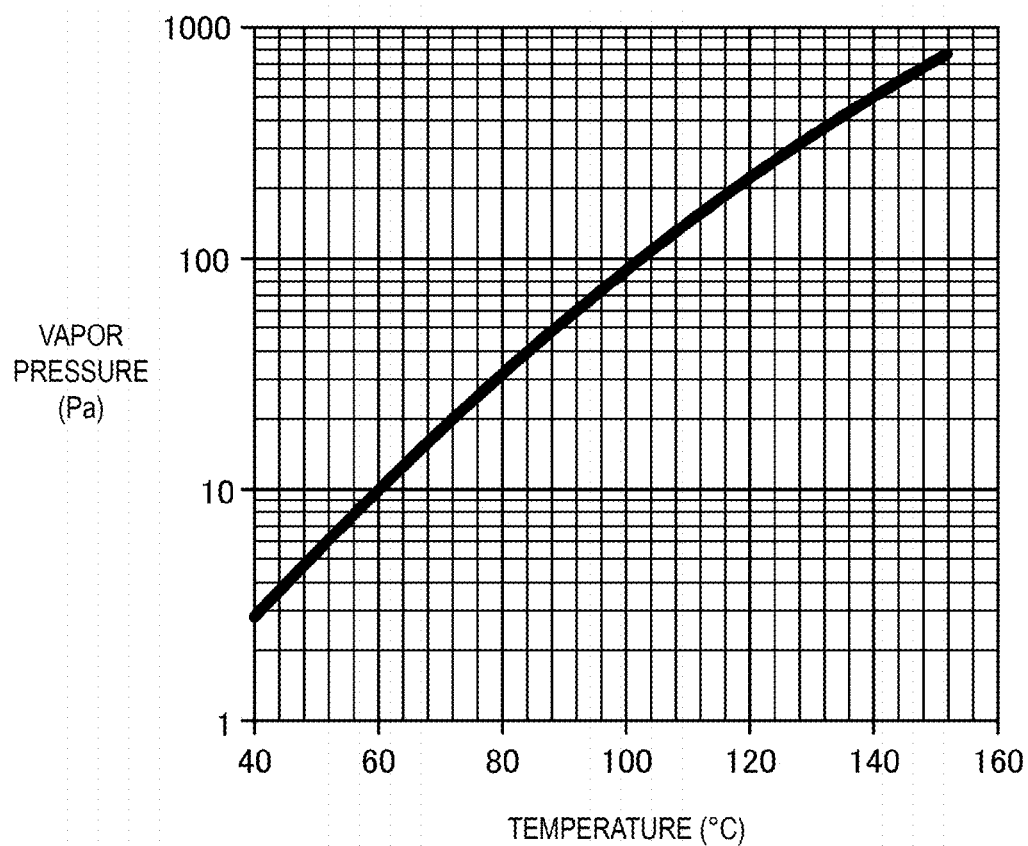
FIG. 3 is a graph showing a vapor pressure curve of an organic material used in the film formation method according to the first embodiment of the disclosure.

FIGS. 1 to 3 illustrate an embodiment of a film formation method according to the disclosure. Here, FIG. 1 is a schematic diagram illustrating an overview of a film formation apparatus 100 used in the film formation method according to the present embodiment. FIG. 2 is a schematic diagram primarily illustrating a vaporizing chamber 50 constituting the film formation apparatus 100. FIG. 3 is a graph showing a vapor pressure curve of an organic material M used in the film formation method according to the present embodiment.

As illustrated in FIGS. 1 and 2, the film formation apparatus 100 includes the vaporizing chamber 50, a film formation chamber 60, and a connection pipe 55 that connects the vaporizing chamber 50 with the film formation chamber 60.

As illustrated in FIGS. 1 and 2, a vapor deposition source 51 is provided within the vaporizing chamber 50. The organic material M is supplied to the vapor deposition source 51 in a liquid state via a material pipe 45 from a material tank 40. The organic material M is vaporized by the vapor deposition source 51, and a vaporized material G produced by vaporizing the organic material M is discharged to the connection pipe 55. Here, as illustrated in FIG. 2, an inert gas such as helium or nitrogen is introduced to valves provided in the channels formed by the material pipe 45 and the connection pipe 55 disposed within the vaporizing chamber 50. The valves replace the atmosphere within those channels with the inert gas. As illustrated in FIG. 2, the inert gas such as helium or nitrogen is introduced while controlling the flow rate of that gas using a mass flow controller 52 provided in the channel formed by the connection pipe 55. As a result, the atmosphere in the channel formed by the connection pipe 55 is replaced with the inert gas. The vaporizing chamber 50 is configured to hold an internal temperature and an internal pressure within a predetermined range.

As illustrated in FIGS. 1 and 2, the film formation chamber 60 contains a film formed substrate S and is configured to form a vapor deposition film F by depositing the vaporized material G supplied from the connection pipe 55 onto a surface of the film formed substrate S. A stage is provided within the film formation chamber 60. The film formed substrate S is placed on the stage, and the temperature of the film formed substrate S placed on the stage is thus held within the predetermined range. The film formation chamber 60 is also configured to hold an internal temperature and an internal pressure within a predetermined range.

The film formation apparatus 100 is configured so that when forming the vapor deposition film F on the surface of the film formed substrate S, the internal temperature of the vaporizing chamber 50 is held lower than the reaction temperature of the organic material M, the internal pressure of the vaporizing chamber 50 is held at the saturated vapor pressure of the organic material M, the internal temperatures of the film formation chamber 60 and the connection pipe 55 are set to be the same as the internal temperature of the vaporizing chamber 50, and the film formed substrate S is held lower than the internal temperature of the film formation chamber.

A film formation method using the film formation apparatus 100 according to the present embodiment will be described next.

First, the organic material M is subjected to differential scanning calorimetry (DSC) to consider the internal temperature of the vaporizing chamber 50, the film formation chamber 60, and the connection pipe 55; and the reaction temperature of the organic material M is measured. An acrylic monomer, a polyurea monomer, a polyamide monomer, a polysiloxane monomer, a polyurethane monomer, and the like can be given as examples of the organic material M, for example. Note that the internal temperature of the vaporizing chamber 50, the film formation chamber 60, and the connection pipe 55 is set to be lower than the reaction temperature at which the organic material M polymerizes.

Specifically, if the organic material M is an acrylic monomer having a molecular weight of 1000, the reaction temperature is approximately 70° C. Accordingly, the internal temperature of the vaporizing chamber 50, the film formation chamber 60, and the connection pipe 55 is set to be lower than approximately 70° C., namely, to approximately 60° C.

Next, after a vapor pressure curve of the organic material M (see FIG. 3) has been found, the temperature and pressure at two points, for example, are read from the vapor pressure curve. Specifically, at 40° C. ($T_1$=313 K), for example, the pressure is 3 Pa ($P_1$=3 Pa), and at 140° C. ($T_2$=413 K), the pressure is 500 Pa ($P_2$=500 Pa).

Furthermore, a latent heat of vaporization L is calculated by substituting the values of the above-described temperatures, pressures, and R (gas constant=8.31441 J/(mol·K)) into the formula $\log_{10}(P_2/P_1)=-L/2.303R(1/T_2-1/T_1)$. Here, the specific latent heat of vaporization L is 54.965 kJ/mol.

Next, assuming that $\tau_0=1.0\times10^{-13}$, an average adsorption time $\tau$ is calculated by substituting the values of L, R, and T in the formula $\tau=\tau_0 e^{L/RT}$. Here, the specific average adsorption time $\tau$ is $2.23\times10^{-2}$ s at −20° C. (253 K), $1.49\times10^{-4}$ s at 40° C. (313 K), $4.19\times10^{-5}$ s at 60° C. (333 K), $1.36\times10^{-5}$ s at 80° C. (353 K), and $8.95\times10^{-7}$ s at 140° C. (413 K).

Next, assuming that $\mu$=1000 (the molecular weight of the acrylic monomer), a molecular velocity v is calculated by substituting R and T into the formula $v=(3RT/\mu\times10^{-3})^{1/2}$. Here, the specific molecular velocity v is 88 m/s when the temperature is 40° C. (313 K), 91 m/s when the temperature is 60° C. (333 K), and 94 m/s when the temperature is 80° C. (353 K). Calculating a time t for a flight of 2.5 cm from the exit end of the connection pipe 55 results in $2.83\times10^{-4}$ s at 40° C. (313 K), $2.74\times10^{-4}$ s at 60° C. (333 K), and $2.66\times10^{-4}$ s at 80° C. (353 K).

The average adsorption time $\tau$, velocity v, and flight time t of the acrylic monomer molecules can be calculated in this manner, which makes it possible to determine the acceptability of the film formation (deposition) process conditions.

The specific film formation method is as follows. First, the film formed substrate S is placed within the film formation chamber 60. The internal temperature of the vaporizing chamber 50, the film formation chamber 60, and the connection pipe 55 are held at 60° C. The internal pressure of the vaporizing chamber 50 is held at the saturated vapor pressure of the organic material M at 60° C., which is 10 Pa. Furthermore, the temperature of the film formed substrate S is held at −20° C. The surface temperature of the film formed substrate S is therefore lower than the internal temperature of the film formation chamber 60, and thus the vapor pressure of the vaporized material G drops at the surface of the film formed substrate S. As a result, it becomes easy to deposit particles of the vaporized material G onto the surface of the film formed substrate S. The vapor deposition film F, which is composed of the vaporized material G, can therefore be formed on the surface of the film formed substrate S at a uniform thickness. By then irradiating the formed vapor deposition film F with ultraviolet light or baking the vapor deposition film F, the vapor deposition film F can be polymerized, and an organic film having a uniform thickness can be formed (a polymerization process). Here, the speed at which the vapor deposition film F is formed is determined by the internal temperature of the vaporizing chamber 50, the temperature of the film formed substrate S, and the vaporized surface area of the organic material M in the vapor deposition source 51. Accordingly, the internal temperature of the vaporizing chamber 50 is set to a desired temperature, and once the saturated vapor pressure is attained, the organic material is deposited onto a dummy substrate to find the film formation speed before forming the film on a substrate that will be used as a product. According to the method of the present embodiment, the vaporized material G of the organic material M is introduced into the film formation chamber 60, and the vaporized material G of the organic material M is deposited onto the film formed substrate S to form the film, once the vaporizing chamber 50 has reached a state of vapor-liquid equilibrium. As such, the film can be formed at a highly uniform speed. Accordingly, the film formation time can be found from the desired thickness of the vapor deposition film F, on the basis of the film formation speed found using the dummy substrate. That film formation time can then be used as the process conditions for forming a film on a substrate to be used as a product.

As described thus far, according to the film formation method of the present embodiment, the internal temperature of the vaporizing chamber 50 is held lower than the reaction temperature of the organic material M, the internal pressure of the vaporizing chamber 50 is held at the saturated vapor pressure of the organic material M, the internal temperature of the film formation chamber 60 is set to be the same as the internal temperature of the vaporizing chamber 50, and the film formed substrate S is held at a temperature lower than the internal temperature of the film formation chamber 60. Accordingly, the vapor pressure of the vaporized material G drops at the surface of the film formed substrate S. Here, unlike a typical vacuum vapor deposition method that uses a carrier gas to deposit a material having a relatively high saturated vapor pressure, it is conceivable that the molecules of the vaporized material G obtained by vaporizing the organic material M, which has a relatively low saturated vapor pressure, will move isotropically in a non-flowing atmosphere. As a result, it becomes easy to deposit particles of the vaporized material G onto the surface of the film formed substrate S, even with the organic material M having a low saturated vapor pressure. The vapor deposition film F, which is composed of the vaporized material G, can therefore be formed on the surface of the film formed substrate S at a uniform thickness. Furthermore, an organic film having a uniform thickness can be formed by polymerizing the vapor deposition film F that has been formed at a uniform thickness.

Second Embodiment

Figure 4:
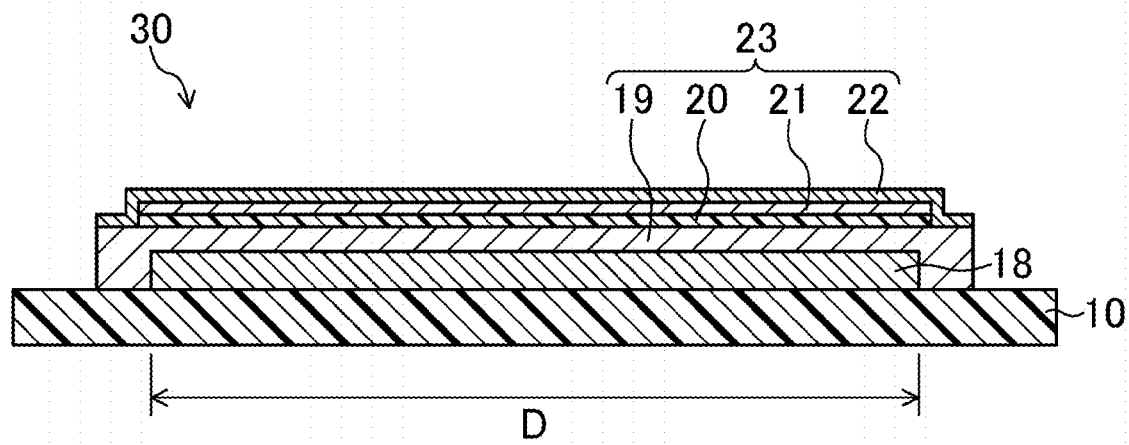
FIG. 4 is a cross-sectional view of an organic EL display device according to a second embodiment of the disclosure, schematically illustrating the configuration of the device.
Figure 5:
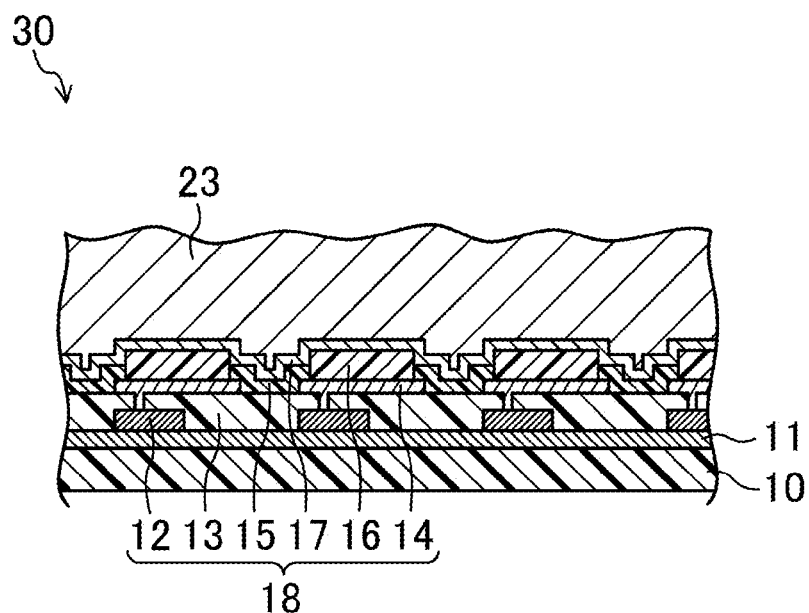
FIG. 5 is a cross-sectional view of the organic EL display device according to the second embodiment of the disclosure, illustrating the internal configuration of the device.
Figure 6:
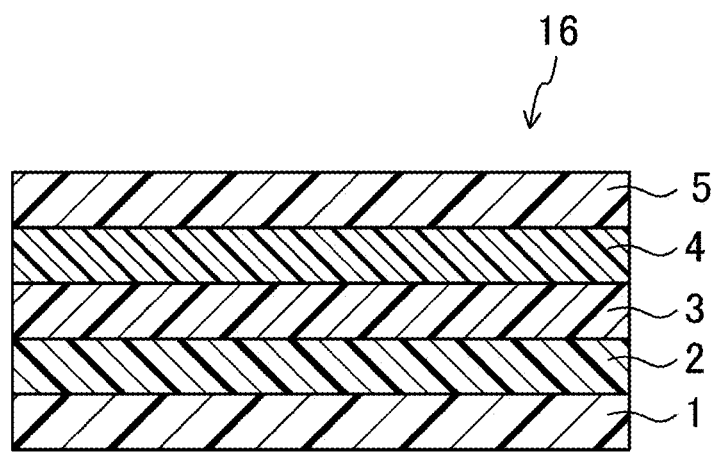
FIG. 6 is a cross-sectional view of an organic EL layer included in an organic EL display device according to the first embodiment of the disclosure.

FIGS. 4 to 11 illustrate an embodiment of a method of manufacturing a display device according to the disclosure. In the present embodiment, an organic EL display device including an organic EL element will be described as an example of a display device including a light emitting element. Here, FIG. 4 is a cross-sectional view of an organic EL display device 30 according to the present embodiment, schematically illustrating the configuration of the device. FIG. 5 is a cross-sectional view of the organic EL display device 30, illustrating the internal configuration of the device. FIG. 6 is a cross-sectional view of an organic EL layer 16 included in the organic EL display device 30.

As illustrated in FIGS. 4 and 5, the organic EL display device 30 includes a base substrate 10, an organic EL element 18, and a sealing film 23. The organic EL element 18 is provided, as a light emitting element, upon the base substrate 10 with a base coating film 11 interposed therebetween, and the sealing film 23 is provided covering the organic EL element 18. Here, in the organic EL display device 30, a display region D in which images are displayed is provided as a rectangular shape by the organic EL element 18, and in the display region D, a plurality of pixels are arranged in a matrix. Each of the pixels includes a subpixel for displaying a red tone, a subpixel for displaying a green tone, and a subpixel for displaying a blue tone, for example. These subpixels are disposed adjacent to one another. Note that in the organic EL display device 30, a frame-shaped frame region is defined in the periphery of the rectangular display region D.

The base substrate 10 is a flexible plastic substrate formed from a polyimide resin or the like, for example.

The base coating film 11 is an inorganic insulating film such as a silicon oxide film, a silicon nitride film, or a silicon oxynitride film, for example.

As illustrated in FIG. 5, the organic EL element 18 includes a plurality of TFTs 12, a flattening film 13, a plurality of first electrodes 14, an edge cover 15, a plurality of organic EL layers 16, and a second electrode 17, provided in that order on the base coating film 11.

The TFT 12 is a switching element provided for each of the subpixels in the display region D. Here, the TFTs 12 each include, for example, semiconductor layer, a gate insulating film, a gate electrode, an interlayer insulating film, and source and drain electrodes. The semiconductor layer is provided on the base coating film 11 in an island shape. The gate insulating film is provided covering the semiconductor layer. The gate electrode is provided on the gate insulating film so as to overlap with a part of the semiconductor layer. The interlayer insulating film is provided covering the gate electrode. The source and drain electrodes are arranged separated from each other. In the present embodiment, the top-gate type is described as an example of the TFT 12, but the TFT 12 may be of the bottom-gate type.

As illustrated in FIG. 5, the flattening film 13 is provided to cover the TFTs 12 except for a portion of each of the drain electrodes. Here, the flattening film 13 is composed of a colorless transparent organic resin material such as an acrylic resin, for example.

As illustrated in FIG. 5, the plurality of first electrodes 14 are provided in a matrix over the flattening film 13, corresponding to a plurality of subpixels. Here, as illustrated in FIG. 5, the first electrodes 14 are connected to the respective drain electrodes of the TFTs 12 via respective contact holes formed in the flattening film 13. The first electrode 14 functions to inject holes into the organic EL layer 16. It is more preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the first electrode 14 include alloys, the examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, the examples of which include tin oxide (SnO), zinc oxide (ZnO), indium tin oxide (ITO), and indium zinc oxide (IZO). The first electrode 14 may include a stack of two or more layers of any of the above-mentioned materials. Examples of materials having a large work function include indium tin oxide (ITO) and indium zinc oxide (IZO).

As illustrated in FIG. 5, the edge cover 15 is provided in a lattice pattern so as to cover the peripheral portions of each of the first electrodes 14. Examples of materials that may constitute the edge cover 15 include inorganic films such as silicon oxide ($SiO_2$), silicon nitride (SiNx (x is a positive number)) such as trisilicon tetranitride ($Si_3N_4$), and silicon oxynitride (SiON), or organic films such as polyimide resins, acrylic resins, polysiloxane resins, and novolac resins.

As illustrated in FIG. 5, the plurality of organic EL layers 16 are arranged in a matrix on the respective first electrodes 14, and correspond to the respective subpixels. Here, as illustrated in FIG. 6, the organic EL layers 16 each include a hole injection layer 1, a hole transport layer 2, a light-emitting layer 3, an electron transport layer 4, and an electron injection layer 5, which are arranged in that order over the first electrode 14.

The hole injection layer 1 is also referred to as an anode buffer layer, and functions to reduce the energy level difference between the first electrode 14 and the organic EL layer 16 so as to improve the efficiency of hole injection into the organic EL layer 16 from the first electrode 14. Examples of materials that may constitute the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Examples of materials that may constitute the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where, when a voltage is applied via the first electrode 14 and the second electrode 17, holes and electrons are injected from the first electrode 14 and the second electrode 17, respectively, and the holes and the electrons recombine. Here, the light-emitting layer 3 is formed from a material having a high light emitting efficiency. Examples of materials that may constitute the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine deriatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate the efficient migration of the electrons to the light-emitting layer 3. Examples of materials that may constitute the electron transport layer 4 include organic compounds, the examples of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to reduce the energy level difference between the second electrode 17 and the organic EL layer 16, to improve the efficiency of electron injection into the organic EL layer 16 from the second electrode 17. Because of this function, the driving voltage for the organic EL element 18 can be reduced. The electron injection layer 5 is also referred to as a cathode buffer layer. Examples of materials that may constitute the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

As illustrated in FIG. 5, the second electrode 17 is provided so as to cover the organic EL layers 16 and the edge cover 15, and is provided in common for the plurality of subpixels. The second electrode 17 functions to inject electrons into the organic EL layer 16. It is more preferable that the second electrode 17 includes a material having a small work function to improve the efficiency of electron injection into the organic EL layer 16. Examples of materials that may constitute the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the second electrode 17 include alloys, the examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 17 include electrically conductive oxides, the examples of which include tin oxide (SnO), zinc oxide (ZnO), indium tin oxide (ITO), and indium zinc oxide (IZO). The second electrode 17 may include a stack of two or more layers of any of the above-mentioned materials. Examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 4, the sealing film 23 includes a first inorganic layer 19, an organic layer 20, a second inorganic layer 21, and a third inorganic layer 22. The first inorganic layer 19 is provided so as to cover the organic EL element 18. The organic layer 20 and the second inorganic layer 21 are layered in that order on the first inorganic layer 19. The third inorganic layer 22 is provided so as to cover a perimeter edge surface of the organic layer 20 and the second inorganic layer 21.

The first inorganic layer 19, the second inorganic layer 21, and the third inorganic layer 22 are composed of an inorganic insulating film such as a silicon nitride film, a silicon oxide film, a silicon oxynitride film, or the like, for example. Preferably, the second inorganic layer 21 is composed of a silicon nitride film, which has high barrier properties, for example.

As illustrated in FIG. 4, the perimeter edge surfaces of the first inorganic layer 19 are located further outward than the perimeter edge surfaces of the organic layer 20 and the second inorganic layer 21.

The organic layer 20 is composed of an organic resin material such as an acrylate, polyurea, parylene, polyimide, polyamide, or the like, for example. As illustrated in FIG. 4, the locations of the perimeter edge surfaces of the organic layer 20 match the locations of the perimeter edge surfaces of the second inorganic layer 21, as a result of the manufacturing method described later.

The above-described organic EL display device 30 is flexible. In each of the subpixels, the light-emitting layer 3 of the organic EL layer 16 is caused, via the TFT 12, to emit light as appropriate so as to display images.

A method of manufacturing the organic EL display device 30 according to the present embodiment will be described next using FIGS. 7 to 11. FIGS. 7 to 11 are cross-sectional views illustrating the method of manufacturing the organic EL display device 30. The method of manufacturing the organic EL display device 30 according to the present embodiment includes forming an organic EL element and forming a sealing film. Forming the sealing film includes forming a first inorganic layer, forming an organic film, forming a second inorganic layer, forming an organic layer, and forming a third inorganic layer.

Forming Organic EL Element

Using a known method, the base coating film 11 and the organic EL element 18 (the TFTs 12, the flattening film 13, the first electrodes 14, the edge cover 15, the organic EL layers 16 (the hole injection layer 1, the hole transport layer 2, the light-emitting layer 3, the electron transport layer 4, and the electron injection layer 5), and the second electrode 17) are formed on the surface of the base substrate 10, which is made from a polyimide resin, for example.

Forming Sealing Film

Figure 7:
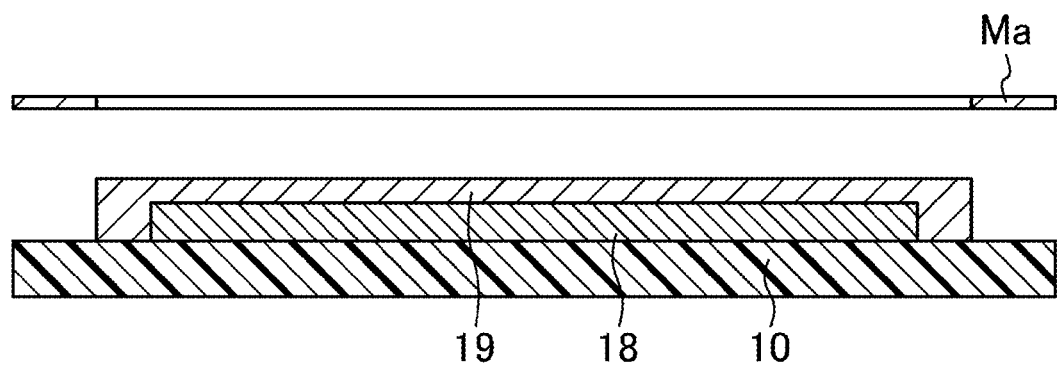
FIG. 7 is a cross-sectional view illustrating a method of manufacturing the organic EL display device according to the first embodiment of the disclosure.

First, as illustrated in FIG. 7, the first inorganic layer 19 is formed by using a mask Ma to form an inorganic insulating film, such as a silicon nitride film, through plasma CVD at a thickness of approximately 500 nm so as to cover the organic EL element 18 formed in the above-described formation of the organic EL element (forming a first inorganic layer).

Figure 8:
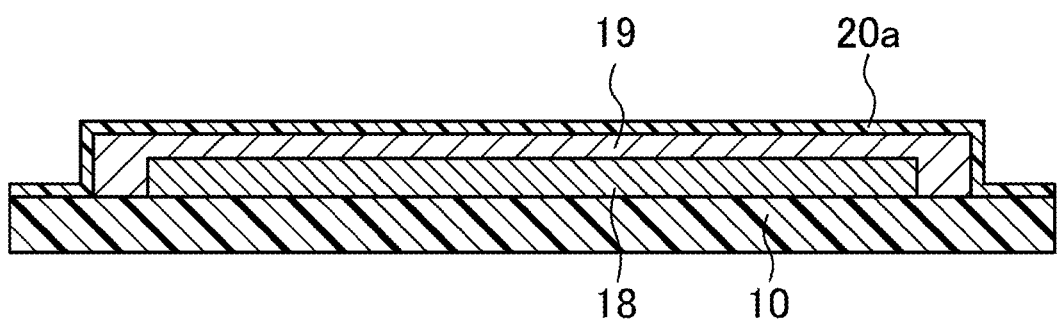
FIG. 8 is a cross-sectional view illustrating the method of manufacturing the organic EL display device according to the first embodiment of the disclosure, continuing from FIG. 7.

Next, as illustrated in FIG. 8, an organic film 20a composed of the organic material M, such as an acrylate, is formed at a thickness of from approximately 100 nm to 300 nm over the entire surface of the substrate on which the first inorganic layer 19 has been formed, using the film formation method described above in the first embodiment (forming an organic film).

Figure 9:
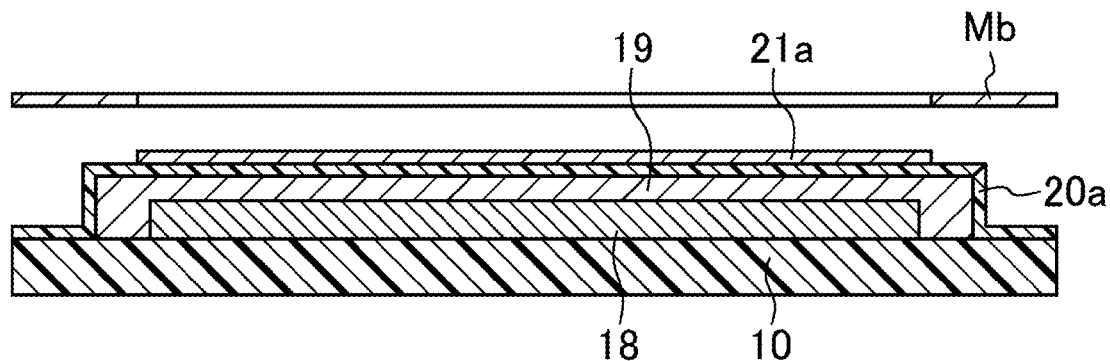
FIG. 9 is a cross-sectional view illustrating the method of manufacturing the organic EL display device according to the first embodiment of the disclosure, continuing from FIG. 8.

Then, as illustrated in FIG. 9, the second inorganic layer 21 is formed so as to overlap with the first inorganic layer 19 by using a mask Mb to form an inorganic insulating film, such as a silicon nitride film, through plasma CVD at a thickness of approximately 200 nm, onto the substrate on which the organic film 20a has been formed (forming a second inorganic film). Here, the area of the opening in the mask Mb is smaller than the area of the opening in the mask Ma (see FIGS. 7 and 9).

Figure 10:
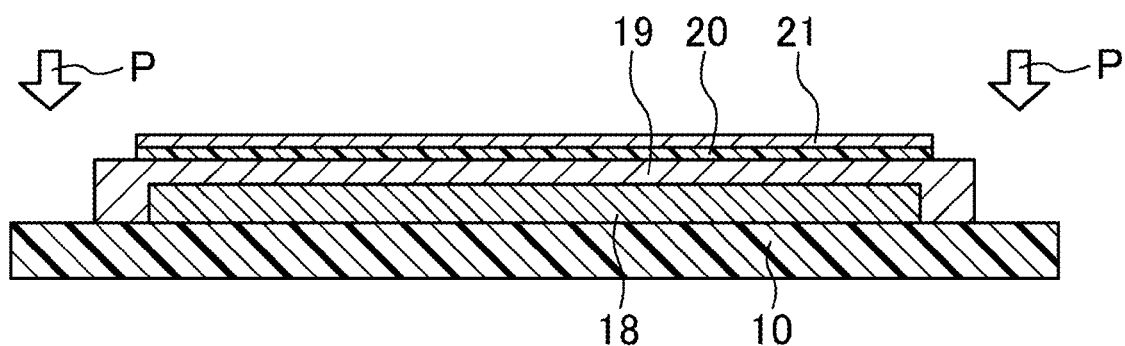
FIG. 10 is a cross-sectional view illustrating the method of manufacturing the organic EL display device according to the first embodiment of the disclosure, continuing from FIG. 9.

Furthermore, as illustrated in FIG. 10, the organic layer 20 is formed by using the second inorganic layer 21 as a mask and ashing (using plasma P, for example) the organic film 20a exposed from the second inorganic layer 21 (forming an organic layer). In this manner, ashing the organic film 20a using the second inorganic layer 21 as a mask results in the locations of the perimeter edge surfaces of the organic layer 20 coinciding with the locations of the perimeter edge surfaces of the second inorganic layer 21. In this specification, the (locations of the) perimeter edge surfaces coinciding refers to a state in which skew between the perimeter edge surfaces is within from 1 μm to 2 μm.

Figure 11:
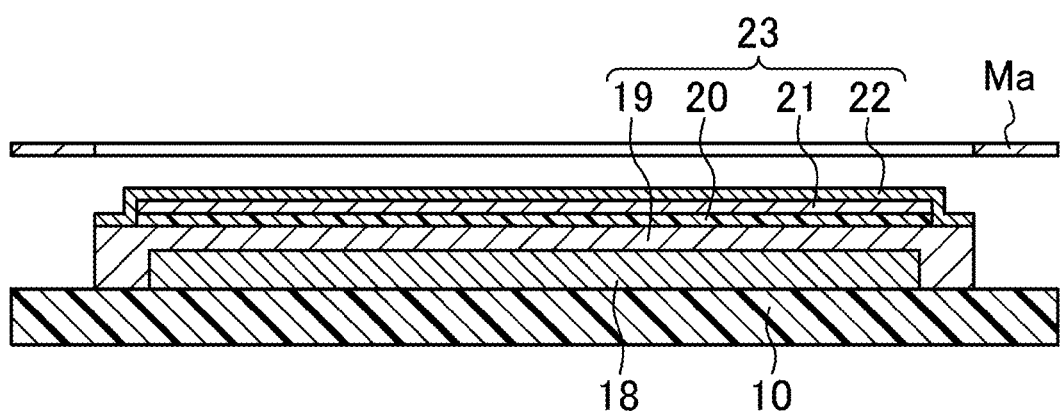
FIG. 11 is a cross-sectional view illustrating the method of manufacturing the organic EL display device according to the first embodiment of the disclosure, continuing from FIG. 10.

Finally, as illustrated in FIG. 11, the third inorganic layer 22 is formed by using the mask Ma to form an inorganic insulating film, such as a silicon nitride film, through plasma CVD at a thickness of approximately from 400 nm to 500 nm on the substrate on which the organic layer 20 has been formed so as to cover the perimeter edge surfaces of the organic layer 20 and the second inorganic layer 21 (forming a third inorganic layer). Here, the mask Ma, which was used when forming the first inorganic layer 19, is used to form the third inorganic layer 22, and thus the perimeter edge surfaces of the third inorganic layer 22 conform to (match) the perimeter edge surfaces of the first inorganic layer 19. In the present specification, "conform to" refers to the perimeter edge surfaces of a thin film formed later matching, to a certain degree, the perimeter edge surfaces of a thin film formed earlier, due to the films being formed using the same mask. The perimeter edge surfaces do not strictly match each other due to the alignment precision of the mask, flowing of the CVD film formation material, and the like.

The organic EL display device 30 of the present embodiment can be manufactured in this manner.

As described thus far, according to the method of manufacturing the organic EL display device 30 of the present embodiment, the organic film 20a can be formed having a uniform thickness. In the formation of the organic layer, the organic layer 20 is formed having removed the organic film 20a exposed from the second inorganic layer 21, and the perimeter edge surfaces of the second inorganic layer 21 coincide with the perimeter edge surfaces of the organic layer 20 as a result. This makes it possible to form circumferential end parts of the organic layer 20 in a precise manner. Additionally, the third inorganic layer 22 is provided so as to cover the perimeter edge surfaces of the second inorganic layer 21, and thus the sealing film 23, in which the first inorganic layer 19, the organic layer 20, the second inorganic layer 21, and the third inorganic layer 22 are layered in that order, can be formed. The sealing properties of the sealing film 23 can therefore be ensured. Thus, the circumferential end parts of the organic layer 20 can be formed with precision to achieve a narrower frame while at the same time ensuring the sealing properties of the sealing film 23.

Furthermore, according to the method of manufacturing the organic EL display device 30 of the present embodiment, in the formation of the organic layer, the organic film 20a exposed from the second inorganic layer 21 is removed using the second inorganic layer 21 as a mask. It is therefore not necessary to prepare a separate mask, and the locations of the perimeter edge surfaces of the second inorganic layer 21 can be caused to coincide with the locations of the perimeter edge surfaces of the organic layer 20.

In the present embodiment, the example of the organic EL layer including the five-layer structure including the hole injection layer, the hole transport layer, the light-emitting layer, the electron transport layer, and the electron injection layer is given. It is also possible that, for example, the organic EL layer may include a three-layer structure including a hole injection-cum-transport layer, a light-emitting layer, and an electron transport-cum-injection layer.

In the present embodiment, the example of the organic EL display device including the first electrode as an anode and the second electrode as a cathode is given. However, the disclosure is also applicable to an organic EL display device, in which the layers of the structure of the organic EL layer are in reverse order, with the first electrode being a cathode and the second electrode being an anode.

In the present embodiment, the example of the organic EL display device including the element substrate in which, the electrode of the TFT connected to the first electrode is the drain electrode is given. However, the disclosure is also applicable to an organic EL display device including an element substrate, in which the electrode of the TFT connected to the first electrode is referred to as the source electrode.

Although the present embodiment describes an organic EL display device as an example of a display device, the disclosure can be applied in display devices including a plurality of electro-optical elements that are driven by an electrical current. For example, the disclosure is applicable to display devices including quantum dot light emitting diodes (QLEDs), which are light emitting elements using a quantum dot-containing layer.

INDUSTRIAL APPLICABILITY

As described above, the disclosure is applicable in flexible display devices.

REFERENCE SIGNS LIST

F Vapor deposition film
G Vaporized material
M Organic material
S Film formed substrate
10 Base substrate
18 Organic EL element (light emitting element)
19 First inorganic layer
20 Organic layer
20a Organic film
21 Second inorganic layer
22 Third inorganic layer
23 Sealing film
30 Organic EL display device
50 Vaporizing chamber
60 Film formation chamber

The invention claimed is:

1. A film formation method of introducing, into a film formation chamber, a vaporized material obtained by vaporizing a liquid-form organic material in a vaporizing chamber and forming a vapor deposition film composed of the vaporized material on a surface of a film formed substrate placed within the film formation chamber, the method comprising:
    holding an internal temperature of the vaporizing chamber at a lower temperature than a reaction temperature at which the organic material polymerizes;
    holding an internal pressure of the vaporizing chamber at a saturated vapor pressure of the organic material;
    setting an internal temperature of the film formation chamber to the same temperature as the internal temperature of the vaporizing chamber; and
    forming the film in a state where the film formed substrate is held at a temperature lower than the internal temperature of the film formation chamber.

2. The film formation method according to claim 1,
    wherein the reaction temperature is determined through differential scanning calorimetry on the organic material.

3. A method of manufacturing a display device, the method comprising:
    a light emitting element formation step of forming a light emitting element on a base substrate; and
    a sealing film formation step of forming a sealing film covering the light emitting element,
    wherein the sealing film formation step includes an organic film formation step of forming an organic film covering the light emitting element, the organic film being formed by forming a vapor deposition film through the film formation method according to claim 1.

4. The method of manufacturing a display device according to claim 3,
    wherein the sealing film formation step includes:
    a first inorganic layer formation step of forming a first inorganic layer covering the light emitting element, before the organic film formation step;
    forming the organic film covering the first inorganic layer in the organic film formation step;
    a second inorganic layer formation step of forming a second inorganic layer, overlapping with the first inorganic layer, on the organic film, after the organic film formation step;
    an organic layer formation step of forming an organic layer by removing the organic film exposed from the second inorganic layer through ashing; and
    a third inorganic layer formation step of forming a third inorganic layer covering a perimeter edge surface of the organic layer and the second inorganic layer.

5. The method of manufacturing a display device according to claim 4,
    wherein the sealing film formation step includes a polymerization step of forming the organic film by irradiating the vapor deposition film with ultraviolet light and causing the vapor deposition film to polymerize, the polymerization step being carried out between the organic film formation step and the second inorganic layer formation step.

6. The method of manufacturing a display device according to claim 4,
    wherein in the organic layer formation step, the organic film is removed using the second inorganic layer as a mask.

7. The method of manufacturing a display device according to claim 3,
    wherein the light emitting element is an organic EL element.

* * * * *